United States Patent
Park et al.

(10) Patent No.: US 10,602,646 B2
(45) Date of Patent: Mar. 24, 2020

(54) METHOD FOR PREPARING MAGNETIC IRON OXIDE-GRAPHENE COMPOSITE

(71) Applicant: LG Chem, Ltd., Seoul (KR)

(72) Inventors: Se Ho Park, Daejeon (KR); Kwon Nam Sohn, Daejeon (KR); Won Jong Kwon, Daejeon (KR); Seung Bo Yang, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/743,859

(22) PCT Filed: Oct. 28, 2016

(86) PCT No.: PCT/KR2016/012214
§ 371 (c)(1),
(2) Date: Jan. 11, 2018

(87) PCT Pub. No.: WO2017/074086
PCT Pub. Date: May 4, 2017

(65) Prior Publication Data
US 2018/0206366 A1 Jul. 19, 2018

(30) Foreign Application Priority Data
Oct. 30, 2015 (KR) .................. 10-2015-0152413

(51) Int. Cl.
*B32B 5/16* (2006.01)
*H05K 9/00* (2006.01)
(Continued)

(52) U.S. Cl.
CPC ......... *H05K 9/0075* (2013.01); *C01B 32/184* (2017.08); *C01G 49/06* (2013.01);
(Continued)

(58) Field of Classification Search
CPC ....... C01B 32/19; C01B 32/225; B82Y 30/00; B82Y 40/00
See application file for complete search history.

(56) References Cited

U.S. PATENT DOCUMENTS

| 6,242,500 B1 | 6/2001 | Lan et al. |
| 2012/0168383 A1 | 7/2012 | Koo et al. |

(Continued)

FOREIGN PATENT DOCUMENTS

| CN | 102583336 A | 7/2012 |
| CN | 102390830 B | 4/2013 |

(Continued)

OTHER PUBLICATIONS

Parvez et al., Exfoliation of Graphite into Graphene in Aqueous Solutions of Inorganic Salts, J. Am. Chem. Soc. 2014, 136, 6083-6091 (Year: 2014).*

(Continued)

*Primary Examiner* — Hoa (Holly) Le

(57) ABSTRACT

The present invention relates to a method for preparing a magnetic iron oxide-graphene composite, a magnetic iron oxide-graphene composite prepared thereby and a composition for electromagnetic wave shielding including the same, and since graphene is prepared from a stage 1-GIC using $FeCl_3$, magnetic particles in the form of $FeO_x$ are naturally formed on the surface of graphene during the preparation process. In addition, a magnetic material is formed on the surface of graphene while the defects of graphene are minimized, and thus the magnetic iron oxide-graphene composite prepared according to the present invention can be useful as an electromagnetic wave absorber.

11 Claims, 8 Drawing Sheets

(51) Int. Cl.

| | |
|---|---|
| *C01G 49/08* | (2006.01) |
| *C01G 49/06* | (2006.01) |
| *C01B 32/184* | (2017.01) |
| *H01F 1/00* | (2006.01) |
| *H01F 1/01* | (2006.01) |
| *B82Y 25/00* | (2011.01) |
| *B82Y 40/00* | (2011.01) |

(52) U.S. Cl.
CPC .............. *C01G 49/08* (2013.01); *H01F 1/009* (2013.01); *H01F 1/01* (2013.01); *B82Y 25/00* (2013.01); *B82Y 40/00* (2013.01); *C01P 2004/03* (2013.01); *C01P 2004/04* (2013.01); *C01P 2004/24* (2013.01); *C01P 2004/51* (2013.01); *C01P 2004/80* (2013.01); *C01P 2006/42* (2013.01); *H01F 1/0063* (2013.01); *Y10S 977/734* (2013.01); *Y10S 977/811* (2013.01); *Y10S 977/842* (2013.01); *Y10S 977/896* (2013.01); *Y10S 977/902* (2013.01)

(56) References Cited

U.S. PATENT DOCUMENTS

| | | |
|---|---|---|
| 2013/0105400 A1 | 5/2013 | Lee et al. |
| 2014/0044890 A1 | 2/2014 | Ling et al. |
| 2014/0106153 A1* | 4/2014 | Lin .................. B82Y 30/00 428/220 |
| 2014/0178759 A1 | 6/2014 | Worsley et al. |
| 2015/0259546 A1 | 9/2015 | Kagawa |
| 2016/0236939 A1 | 8/2016 | De Miguel Turullois et al. |
| 2017/0158512 A1 | 6/2017 | Sohn et al. |
| 2017/0166449 A1 | 6/2017 | Yoo et al. |
| 2017/0190583 A1* | 7/2017 | Cesareo .............. C01B 32/19 |
| 2017/0305747 A1* | 10/2017 | Yang .................. B82Y 30/00 |

FOREIGN PATENT DOCUMENTS

| | | | |
|---|---|---|---|
| EP | 3050844 A1 * | 8/2016 | ............. B82Y 30/00 |
| JP | 2011144054 A | 7/2011 | |
| JP | 2014-009151 * | 1/2014 | |
| JP | 5471465 B2 | 4/2014 | |
| JP | 2014103283 A | 6/2014 | |
| JP | 2015023036 A | 2/2015 | |
| KR | 20120076131 A | 7/2012 | |
| KR | 20130036639 A | 4/2013 | |
| KR | 101292151 B1 | 8/2013 | |
| KR | 20140045160 A | 4/2014 | |
| KR | 101467993 B1 | 12/2014 | |
| KR | 20150076093 A | 7/2015 | |
| KR | 20150076105 A | 7/2015 | |
| WO | 2014089214 A2 | 6/2014 | |
| WO | 2015044478 A1 | 4/2015 | |

OTHER PUBLICATIONS

Ahmed et al., "Exfoliation of Magnetic Graphene from Acceptor-type GIC", Graphene Conference, 2014.

Chen et al., "Controllable fabrication of mono-dispersed RGO-hematite nanocomposites and their enhanced wave absorption properties", Journal of Materials Chemistry A, Mar. 2013, vol. 1, pp. 5996-6003.

Fu et al., "Low-temperature exfoliation of multilayer-graphene materials from FeCl3 and CH3NO2 co-intercalated graphite compound", Chem. Commun., Mar. 2011, vol. 47, pp. 5265-5267.

Hui et al., "Synthesis criterion for a metal chloride-graphite intercalation compound by a molten salt method", New Carbon Materials, Mar. 2009, vol. 24, No. 1, pp. 18-22.

International Search Report for Application No. PCT/KR2016/012214 dated Jan. 31, 2017.

Liu et al., "Simple, green and high-yield production of single-or few-layer graphene by hydrothermal exfoliation of graphite", Nanoscale, Royal Society of Chemistry, Jan. 2014.

Maluangnont et al., "Preparation of a Homologous Series of Graphite Alkylamine Intercalataion Compounds Including an Unusual Parallel Bilayer Intercalate Arrangement", Chemisty of Materials, American Chemical Society, Feb. 2011, vol. 23, pp. 1091-1095.

Shen et al., "Lightweight, Multifunctional Polyetherimide/Graphene@Fe3O4 Composite Foams for Shielding of Electromagnetic Pollution", Applied Materials & Interfaces, Oct. 2013, vol. 5, pp. 11383-11391.

Ujihara et al., "Massive-exfoliation of magnetic graphene from acceptor-type GIC by long-chain alkyl amine", Journal of Materials Chemistry A, Royal Society of Chemistry, Oct. 2014, vol. 2, pp. 4244-4250.

Vol'Pin et al., "Lamellar Compunds of Graphite with Transition Metals. Graphite as a Ligand", Journal of the American Chemical Society, Jun. 1975, vol. 97, No. 12, pp. 3366-3373.

Wang et al., "Formation of Metal Chloride-Graphite Intercalation Compounds in Molten Salts", Synthetic Metals, Feb. 1988, vol. 25, pp. 181-187.

Yang et al., "Graphene oxide-iron oxide and reduced graphene oxide-iron oxide hybrid materials for removal of organic and inorganic pollutants", RSC Advances Accepted Manuscript, Jul. 2012.

Yoon et al., "Factors Affecting the Exfoliation of Graphite Intercalation Compunds for Graphene Synthesis", Chemistry of Materials, Feb. 2015, vol. 25, pp. 2067-2073.

Yu et al., "Direct Growth of Layered Intercalation Compunds via Single Step One-pot in situ Synthesis", Chem. Commun, Accepted Manuscript Royal Society of Chemistry, 2015.

* cited by examiner

[FIG. 1]
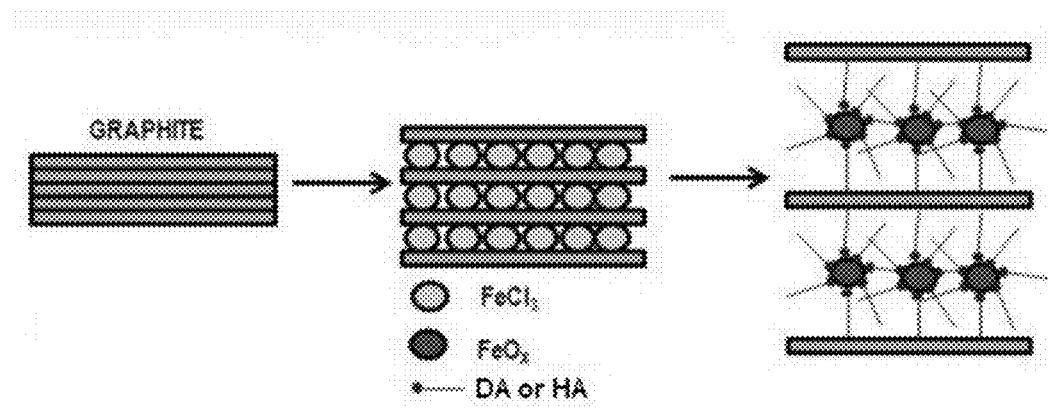
[FIG. 2]
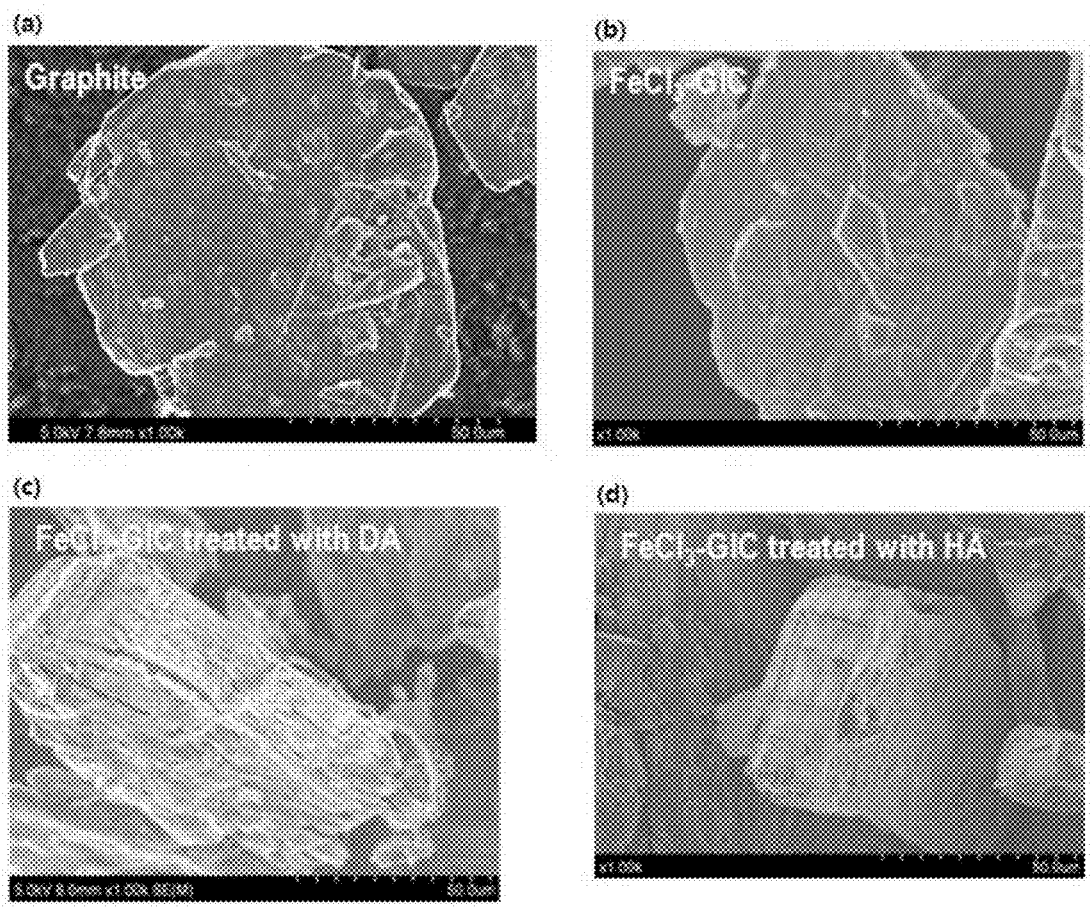

[FIG.3]
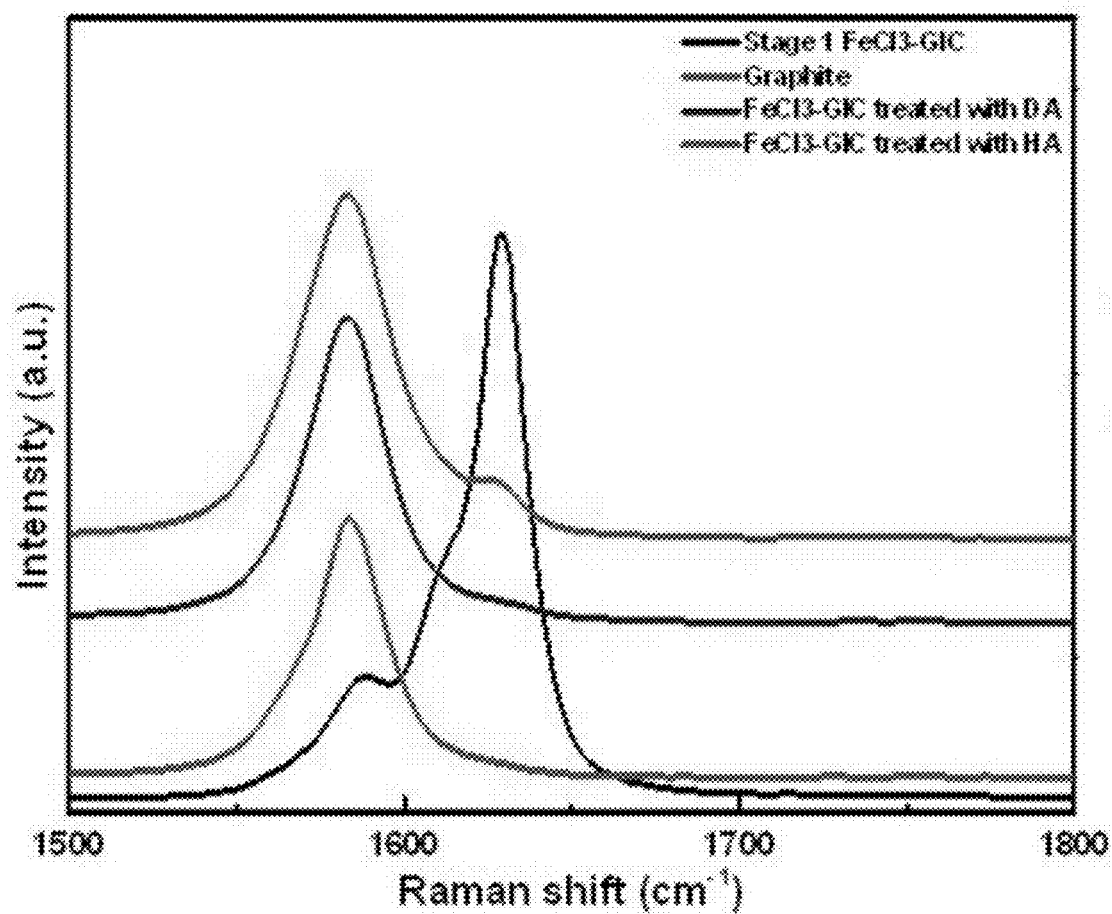

[FIG.4]
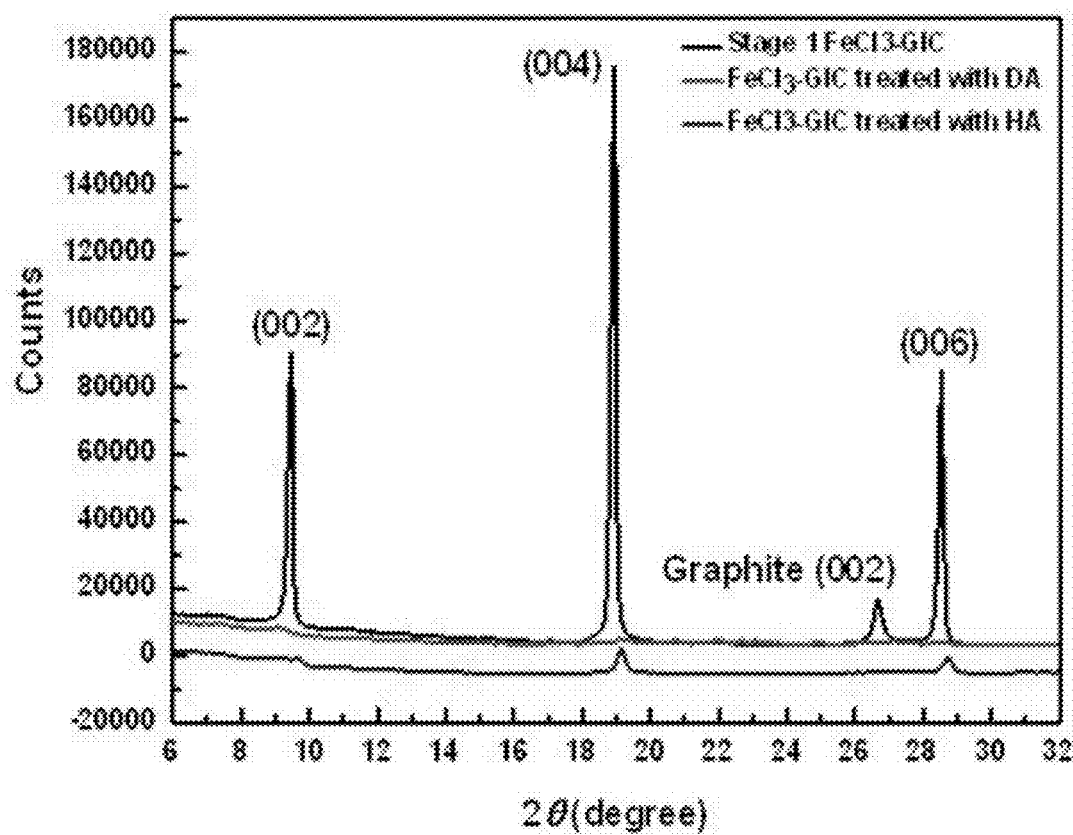

[FIG. 5]
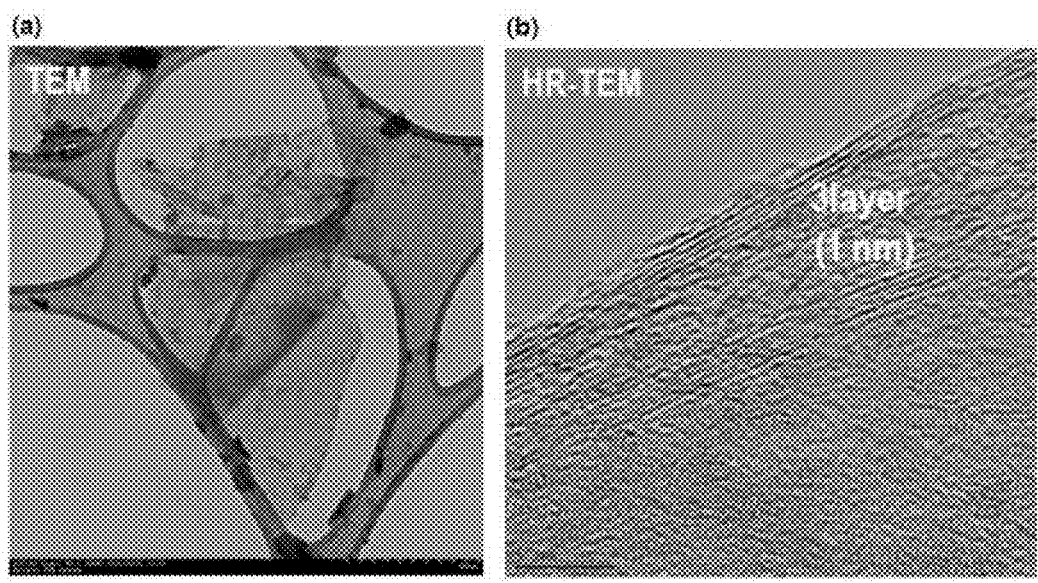
[FIG. 6]
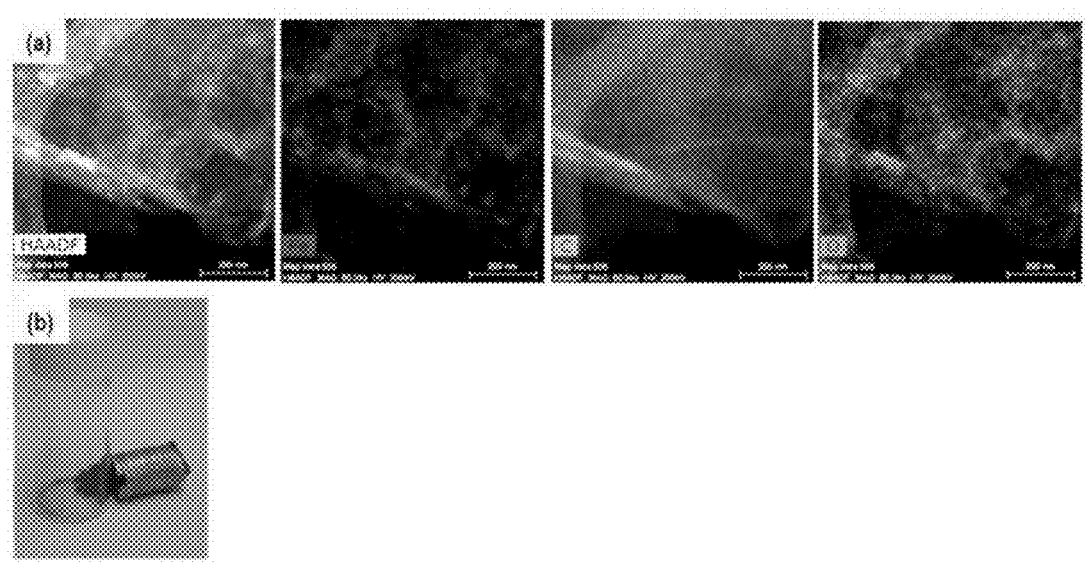

[FIG. 7]
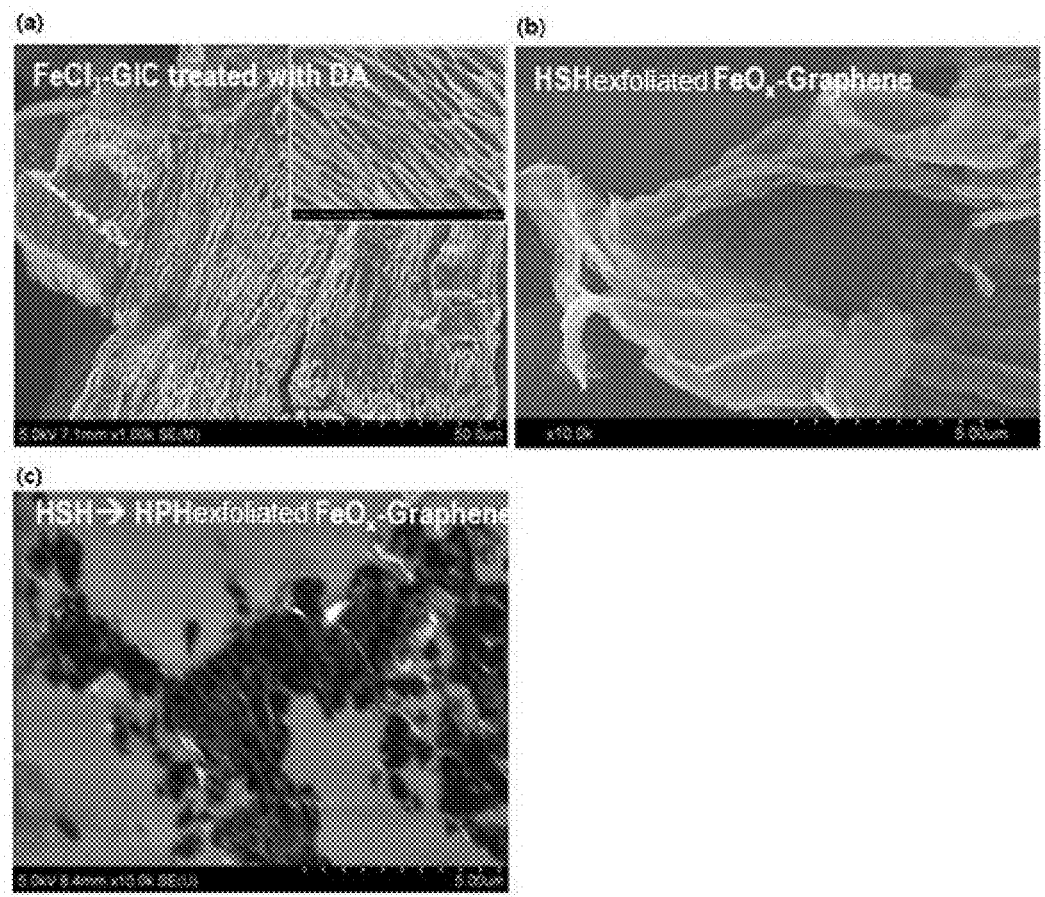

[FIG. 8]
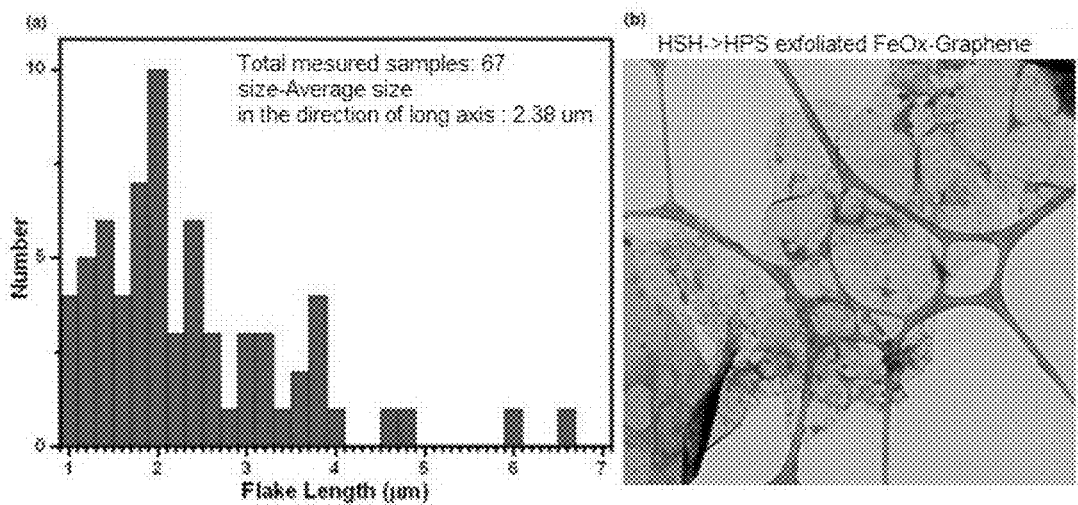

[FIG. 9]
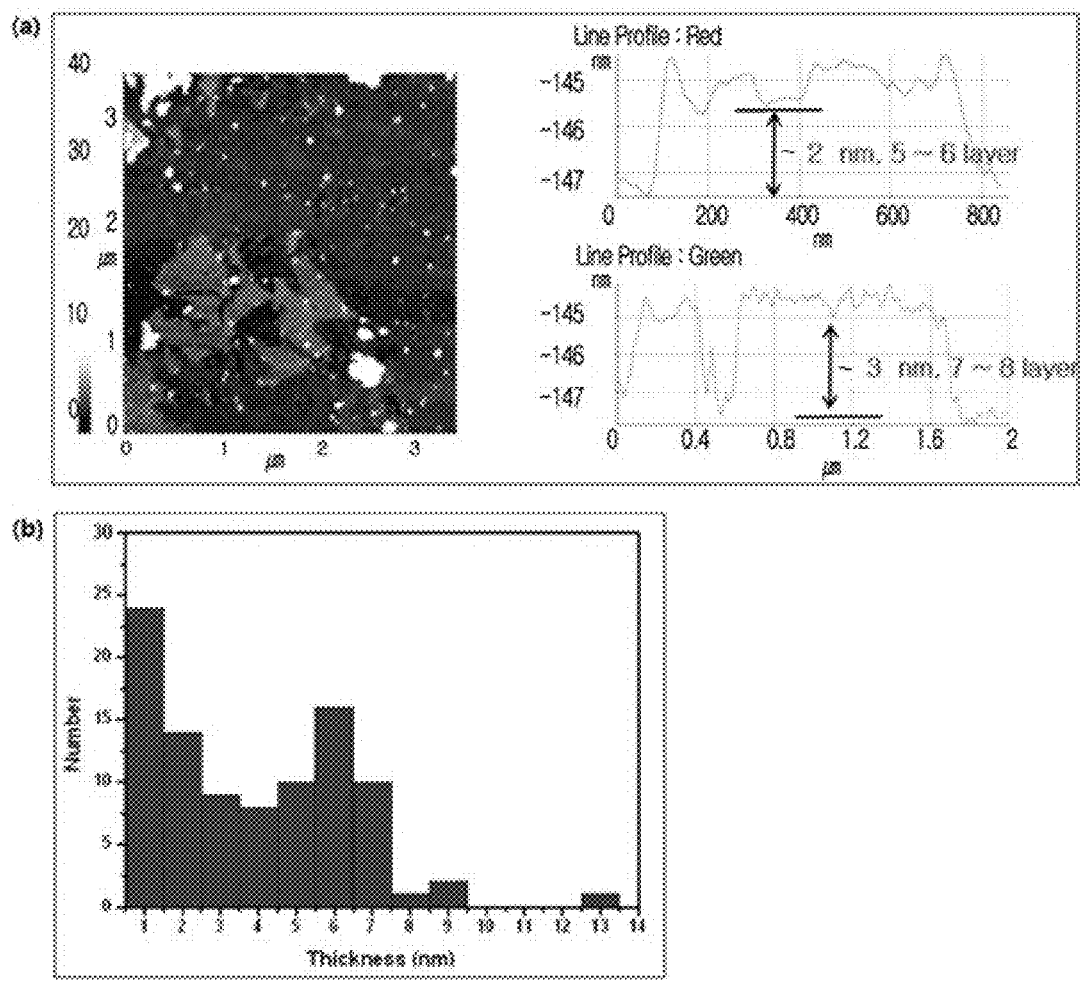

[FIG. 10]
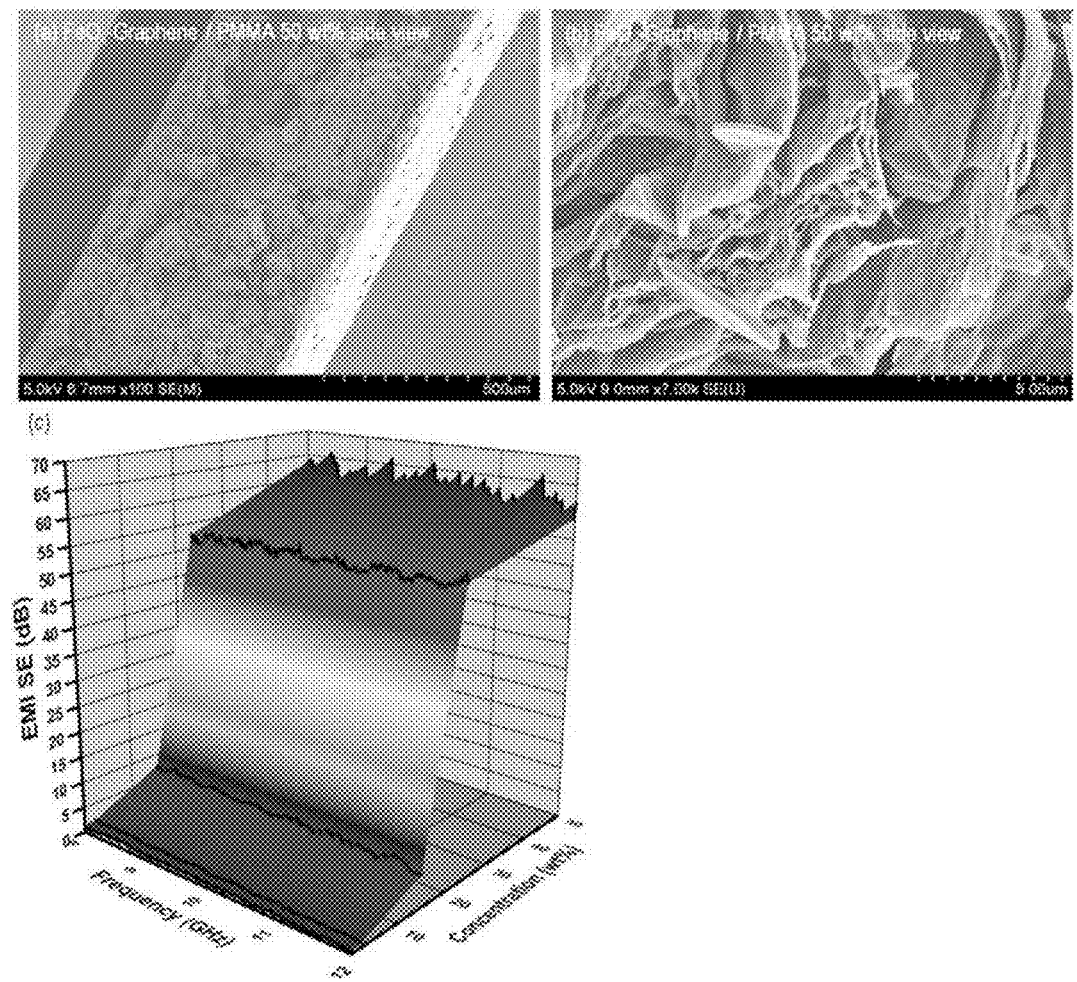

METHOD FOR PREPARING MAGNETIC IRON OXIDE-GRAPHENE COMPOSITE

CROSS-REFERENCE TO RELATED APPLICATION(S)

The present application is a national phase entry under 35 U.S.C. § 371 of International Application No. PCT/KR2016/012214 filed on Oct. 28, 2016, which claims priority from Korean Patent Application No. 10-2015-0152413 filed on Oct. 30, 2015 with the Korean Intellectual Property Office, the disclosures of which are incorporated herein by reference.

TECHNICAL FIELD

The present invention relates to a method for preparing a magnetic iron oxide-graphene composite, a magnetic iron oxide-graphene composite prepared thereby, and a composition for electromagnetic wave shielding including the same.

BACKGROUND ART

Since materials having a two-dimensional structure not only facilitate a synthesis of relatively complicated structures but also is relatively easy to change the properties of the materials, extensive studies thereon have been conducted. Recently, among the materials having a two-dimensional structure, graphene is a one of the materials that have gained the most attention.

Graphene is a semi-metallic material where carbon atoms form an arrangement connected in a hexagonal shape by two-dimensional sp2 bonding while having a thickness corresponding to a carbon atom layer, and has the properties of structural and chemical stability and excellent thermal conductivity. In addition, graphene is consisting of only carbon which is a relatively light element, and thus, easy to be processed in one-dimensional or two-dimensional nano-patterns.

Meanwhile, graphene is highly likely to be used as an electromagnetic wave absorber. In this regard, there are several things that need to be improved. First, since graphene is a non-magnetic material, there is a limitation that it can only absorb microwave energy. In addition, graphene has the disadvantage of having poor impedance matching because the dielectric permittivity and magnetic permeability are not in balance.

As an alternative thereto, a method of introducing a magnetic material onto the surface of graphene has been proposed. However, in the conventionally known method, graphene is prepared from graphite or the like, and then a magnetic material is introduced onto the surface of graphene. In other words, the preparation process of graphene and the introduction process of magnetic materials are divided. Accordingly, it is difficult to uniformly introduce a magnetic material onto the surface of graphene, and there is a high possibility of causing defects on the surface of graphene during the process of introducing a magnetic material.

Meanwhile, various methods for preparing graphene have been reported so far. First, there is a method for preparing graphene by chemical vapor deposition (CVD), which has the advantage of enabling the preparation of high quality graphene, but it is not suitable for mass production due to limited production speed. A method wherein a graphene sheet is exfoliated from graphite by a physical method such as using a tape, is known. However, this method is also not suitable for mass production and has the disadvantage of having a very low exfoliation yield.

Further, there is a method of oxidizing graphite to proceed an exfoliation and reducing the graphene oxide obtained therefrom to obtain graphene. However, there are disadvantages in that toxic substances must be used and that it is difficult to control the defects of graphene.

Accordingly, the present inventors have conducted extensive and intensive studies on a simple and effective method of introducing a magnetic material onto the surface of a graphene, and found that magnetic particles in the form of $FeO_x$ are naturally formed by employing a method of preparing graphene from a graphite intercalation compound (GIC) described later, wherein a halogen salt of iron is used as an intercalant, thereby completing the present invention.

DETAILED DESCRIPTION OF THE INVENTION

Technical Problem

It is an object of the present invention to provide a simple and effective method for preparing a magnetic iron oxide-graphene composite.

It is another object of the present invention to provide a magnetic iron oxide-graphene composite prepared according to the preparation method.

It is a further object of the present invention to provide a composition for electromagnetic wave shielding including the magnetic iron oxide-graphene composite.

Technical Solution

In order to solve the objects mentioned above, the present invention provides a method of preparing a magnetic iron oxide-graphene composite comprising the steps of:

mixing graphite and a halogen salt of iron and heat-treating the same (Step 1);

reacting the product of step 1 with a ($C_{1-20}$ alkyl) amine (Step 2);

washing the product of step 2 (Step 3);

subjecting the product of step 3 to a high-speed homogenization (Step 4); and subjecting the product of step 4 to sonication or a high-pressure homogenization (Step 5).

The preparation method according to the present invention relates to a method of preparing a magnetic iron oxide-graphene composite, in which iron oxide magnetic particles are coated onto the surface of graphene, thereby preparing a magnetic iron oxide-graphene composite having high production efficiency which is useful as an electromagnetic wave shielding material through the use of intercalated graphite, primary amine treatment and graphite exfoliation. In particular, since the intercalated graphite is exfoliated, the surface property of graphene is excellent, and there are environmental benefits because no reducing agent is used.

Hereinafter, the present invention will be described in detail for each step.

Mixing Graphite and Halogen Salt of Iron and Heat-Treating the Same (Step 1)

The step 1 is a step for preparing a GIC (graphite intercalation compound) in which a halogen salt of iron is intercalated between the layers of graphite.

As used herein, the term 'GIC (graphite intercalation compound)' means that a specific compound is intercalated between the layers of graphite, through which the interlayer spacing is wider than that of pristine graphite.

In the present invention, a halogen salt of iron is intercalated between the layers of graphite, and it is converted to iron oxide according to a process described later, thus not only imparting a magnetic property to graphene, but also reacting with a primary amine in step 2 described later.

Preferably, as the halogen salt of iron, $FeCl_3$, $FeCl_2$, or a mixture thereof may be used. Further, the weight ratio of graphite to halogen salt of iron is 1:1 to 1:10, preferably 1:3 to 1:8, more preferably 1:5. The halogen salt of iron can be effectively intercalated between the layers of graphite within the above range.

Further, the heat treatment is preferably carried out at 300° C. to 400° C. Furthermore, the heat treatment is preferably carried out for 24 hours or more, preferably 48 hours or more, more preferably 72 hours or more. In addition, although there is no substantial upper limit of the heat treatment time, it may preferably be, for example, 200 hours or less, 150 hours or less, and 100 hours or less.

Reacting the Product of Step 1 with ($C_{1-20}$ Alkyl) Amine (Step 2)

The step 2 is a step for reacting graphite, in which a halogen salt of iron, the product of step 1, is intercalated, and a primary amine, thereby forming a complex of halogen salt of iron and primary amine intercalated between the layers of graphite.

Since the halogen salt of iron is a Lewis acid, it can form a complex with a primary amine which is a Lewis base. For example, when $FeCl_3$ is used, as schematically shown in FIG. 1, the primary amine can be intercalated between $FeCl_3$ and graphite, thereby expanding the interval between the layers of graphite. In addition, the $FeCl_3$-primary amine complexes can agglomerate with each other in the expanded layers of graphite.

The primary amine is a ($C_{1-20}$ alkyl) amine, and a long alkyl group is preferable. Most preferably, the primary amine is hexylamine, or dodecylamine The step 2 is preferably carried out at 30° C. to 250° C., preferably at 60° C. to 120° C., more preferably at 80° C. to 100° C. Further, the step 2 is preferably carried out for 6 hours or more, preferably 12 hours or more. Furthermore, although there is no substantial upper limit of the execution time of step 2, it may preferably be, for example, 100 hours or less, 90 hours or less, or 80 hours or less.

Washing the Product of Step 2 (Step 3)

The above step is a step for preparing a GIC in which iron oxide is intercalated between the layers of graphite from the graphite in which the halogen salt of iron-primary amine complex is intercalated.

The material that can be used for the washing is not particularly limited as long as it can dissolve the primary amine. For example, water, methanol, ethanol, or propanol may be used. In addition, hydrochloric acid, nitric acid, or sulfuric acid can be used therewith.

When the product of step 2 is washed, the primary amine is dissolved and removed, and at the same time, the halogen salt of iron is oxidized to form iron oxide. The thus-formed iron oxide may remain between the layers of graphite, whereby it can strongly bond to graphite. Accordingly, iron oxide can remain in a state of being bonded to the surface of graphene, even by the exfoliation process of graphene described later.

Further, since the graphite in which iron oxide is intercalated there between is prepared by the washing, the graphite layer previously expanded by the step 2 is not substantially reduced, and therefore, it has advantages in the exfoliation process of graphene described later The iron oxide ($FeO_x$) may be $Fe_3O_4$, or $Fe_2O_3$. Furthermore, after carrying out the step 3, the step for drying the product may further be included.

Subjecting the Product of Step 3 to High-Speed Homogenization (Step 4)

The step 4 is a step for preparing an exfoliation of graphite, and is a step for increasing the dispersibility of graphite in the solution containing graphite before the exfoliation of graphite in the step 5 described later.

The high-speed homogenization refers to stirring the product of step 3, that is, the solution containing graphite in which iron oxide is intercalated there between, and preferably, the solution is stirred at 3000 to 8000 rpm. Further, the high-speed homogenization is preferably carried out for 0.5 to 3 hours. If the homogenization time is less than 0.5 hour, there is a limit that the degree of dispersion is lowered, and if the homogenization time exceeds 3 hours, the degree of dispersion does not substantially increase any more.

The stirring may be carried out using a high-speed homogenizer. The degree of dispersion can be increased by stirring based on the high shear rate ($>10^4$ $sec^{-1}$) applied between the rotor and stator of the high-speed homogenizer. In addition, a part of the interlayers in the graphite having a wide interlayer spacing can be separated. Accordingly, the size of graphite becomes small and the degree of dispersion in the solution become high, thereby significantly increasing the exfoliation efficiency of graphite in step 5 described later.

As the solvent of the solution, at least one selected from the group consisting of water, NMP (N-Methyl-2-pyrrolidone), acetone, DMF (N,N-dimethylformamide), DMSO (Dimethyl sulfoxide), CHP (Cyclohexyl-pyrrolidinone), N12P (N-dodecyl-pyrrolidone), benzyl benzoate, N8P (N-Octyl-pyrrolidone), DMEU (dimethyl-imidazolidinone), cyclohexanone, DMA (dimethylacetamide), NMF (N-Methyl Formamide), bromobenzene, chloroform, chlorobenzene, benzenitrile, quinoline, benzyl ether, ethanol, isopropyl alcohol, methanol, butanol, 2-ethoxyethanol, 2-butoxyethanol, 2-methoxypropanol, THF(tetrahydrofuran), ethylene glycol, pyridine, N-vinylpyrrolidone, methyl ethyl ketone (butanone), alpha-terpineol, formic acid, ethyl acetate and acrylonitrile may be used.

In addition, a dispersant may be used to increase the degree of dispersion of graphite. The dispersant acts to maintain its dispersed state through hydrophobic graphite, interlayer exfoliated expanded graphite or graphene due to amphiphilic properties, and is also referred to as a surfactant in another term. As the dispersant, any dispersant may be used without particular limitation as long as it is used for graphene exfoliation, and for example, an anionic surfactant, a nonionic surfactant, a cationic surfactant and the like can be used. Specific examples thereof include pyrene-based low molecular weight derivatives; cellulosic polymers; cationic surfactants; anionic surfactants; gum arabic; n-dodecyl b-D-maltoside; amphoteric surfactants; polyvinylpyrrolidone-based polymers; polyethylene oxide-based polymers; ethylene oxide-propylene oxide copolymers; tannic acid; or a mixture of plural kinds of polyaromatic hydrocarbon oxides, which is a mixture containing polyaromatic hydrocarbon oxides having a molecular weight of 300 to 1000 in an amount of 60% by weight or more.

The weight ratio between the graphite and the dispersant is preferably 2.5 to 20. If the weight ratio is less than 2.5, the content of the graphite is too low and thus the exfoliation efficiency decreases. If the weight ratio exceeds 20, the content of the dispersant is too low and thus the dispersing effect of the graphite decreases. More preferably, the weight ratio between the graphite and the dispersant is 2.5 to 5.

Further, the concentration of graphite in the solution is preferably 0.5 to 5% by weight. If the concentration is less than 0.5% by weight, the content of graphite is too low and the yield in the exfoliation process decreases. If the concentration exceeds 5% by weight, the content of graphite is too high and thus the effects of high-speed homogenization due to increase in viscosity and graphene exfoliation of step 5 described below decrease.

Meanwhile, the product of step 4 may further include a step of recovering and/or drying as needed. The recovering step may be carried out by centrifugation, vacuum filtration or pressure filtration. Further, the drying step may be carried out by drying at a temperature of about 30 to 200° C.

Subjecting the Product of Step 4 to Sonication or High-Pressure Homogenization (Step 5).

The step 5 is a step for preparing a magnetic iron oxide-graphene composite from the product of step 4 wherein graphene is exfoliated by sonication or high-pressure homogenization.

The step 5 may use the product of step 4 as it is without any further treatment, or may use by further including the solvent and/or dispersant described in step 4 above.

The 'sonication' refers to applying a high frequency to a material to induce dispersion of the material. Preferably, the frequency is 10 to 100 kHz, more preferably 40 kHz.

The 'high pressure homogenization' refers to applying a high pressure to a micro-channel having a diameter in a micrometer scale, and applying a strong shear force to the material passing through it. Generally, the high-pressure homogenization is carried out using a high-pressure homogenizer including an inlet, an outlet, and a micro-channel that connects between the inlet and the outlet and has a diameter in a micrometer scale.

The micro-channel preferably has a diameter of 50 to 300 μm. Further, it is preferable that the feed solution is introduced in the inlet of the high-pressure homogenizer under application of a pressure of 500 to 3000 bar and passes through the micro-channel.

Furthermore, the solution that has passed through the micro-channel can be reintroduced into the inlet of the high-pressure homogenizer, whereby graphene, which has not been exfoliated, can be additionally exfoliated. The reintroducing process may be repeated twice to ten times. The reintroducing process can be carried out by repeatedly using the high-pressure homogenizer used or by using a plurality of high-pressure homogenizers. In addition, the reintroducing process may be separately carried out by each process, or carried out continuously.

Meanwhile, the method may further include a step of recovering and/or drying the magnetic iron oxide-graphene composite from the product prepared in step 5 above. The recovering step may be carried out by centrifugation, vacuum filtration or pressure filtration. Further, the drying step may be carried out by vacuum-drying at a temperature of about 30 to 200° C.

Magnetic Iron Oxide-Graphene Composite

The magnetic iron oxide-graphene composite prepared according to the present invention is characterized in that iron oxide is formed on the surface of graphene.

Since graphene does not exhibit magnetic properties, a magnetic material must be formed on the surface of graphene in order to allow magnetic properties to exhibit. For this purpose, conventionally, a magnetic material, for example, such as Fe seed, was grown on the surface of graphene oxide and then a magnetic material was formed on the surface of graphene through a reduction process. However, the above method requires a high temperature and has to use a reducing agent. In particular, there is a problem that the magnetic material formed on the surface of graphene is non-uniformly formed.

However, the preparation method according to the present invention can be carried out at a relatively low temperature, and iron oxide can be uniformly formed on the surface of graphene without using a reducing agent. Moreover, since the graphene itself has less defects, it is advantageous to express inherent characteristics of graphene.

The graphene prepared according to the present invention has an average lateral size of 0.5 μm to 10 μm. Herein, the 'lateral size' of the graphene can be defined as the longest distance of the linear distance connecting arbitrary two points on the plane of each particle, when each particle of graphene is viewed on a plane having the widest area. Further, the graphene has an average thickness of 0.5 nm to 15 nm.

Furthermore, the iron oxide ($FeO_x$) formed on the graphene may be $Fe_3O_4$ or $Fe_2O_3$.

Composition for Electromagnetic Wave Shielding

In addition, the present invention provides a composition for electromagnetic wave shielding including the magnetic iron oxide-graphene composite.

The electromagnetic wave shielding material is intended to prevent electromagnetic interference (EMI) caused by electromagnetic noise generated in electronic components. The magnetic properties are needed for shielding EMI. Since the graphene prepared according to the present invention has magnetic properties caused by iron oxide, it can be applied as a material for electromagnetic wave shielding.

Except that it includes the magnetic iron oxide-graphene composite according to the present invention as a magnetic material, it may have a constitution of a composition for electromagnetic wave shielding used in the past. For example, the composition for electromagnetic wave shielding may be in the form of a composite including the magnetic iron oxide-graphene composite according to the present invention as a filler and polyamide, polymethyl methacrylate (PMMA), epoxy, acrylonitrile-butadiene-styrene (ABS) plastic, or the like as a matrix.

ADVANTAGEOUS EFFECTS

As described above, the preparation method according to the present invention prepares graphene from a GIC using a halogen salt of iron, and thus has a feature that magnetic particles in the form of $FeO_x$ are naturally formed on the surface of graphene during the preparation process. Such a preparation method has advantages that the method of preparing graphene and the method of forming magnetic material on the surface of graphene are not separately divided, the process is simple, and that a defect of graphene does not substantially occur. In addition, because no toxic substances are generally used, it is environmentally favorable, and there is an advantage that graphene exfoliation efficiency from graphite is high.

BRIEF DESCRIPTION OF DRAWINGS

FIG. 1 schematically shows a process in which the interlayer spacing of graphite widens according to the reaction between $FeCl_3$ and a primary amine in the present invention.

FIG. 2 shows a SEM image of graphite according to an embodiment of the present invention. FIG. 2(a) shows pristine graphite, FIG. 2(b) shows graphite in which $FeCl_3$ is intercalated, and FIGS. 2(c) and 2(d) graphite treated with dodecylamine and hexylamine, respectively.

FIG. 3 shows the result of Raman analysis (FIG. 3(a)) of graphite according to one embodiment of the present invention.

FIG. 4 shows the result of XRD analysis (FIG. 3(b)) of graphite according to one embodiment of the present invention.

FIG. 5 shows a TEM image (FIG. 5(a)) and a HR-TEM image (FIG. 5(b)) of the magnetic iron oxide-graphene composite according to one embodiment of the present invention.

FIG. 6 shows STEM EDS MAPPING images (FIG. 6(a)) and the result of magnetic confirmation (FIG. 6(b)) of the magnetic iron oxide-graphene composite according to one embodiment of the present invention.

FIG. 7 shows a SEM image of the magnetic iron oxide-graphene composite according to one embodiment of the present invention through the preparation process.

FIG. 8 shows the result of lateral size analysis of the magnetic iron oxide-graphene composite according to one embodiment of the present invention. FIG. 8(a) shows the size distribution, and FIG. 8(b) shows a SEM image.

FIG. 9 shows the result of thickness analysis of the magnetic iron oxide-graphene composite according to one embodiment of the present invention.

FIG. 9(a) shows the result of AFM analysis, and FIG. 9(b) shows the thickness distribution.

FIG. 10 shows the result of EMI shielding efficiency measurement of the magnetic iron oxide-graphene composite according to one embodiment of the present invention. FIGS. 10(a) and 10(b) each show a SEM image of the side view of the film, and FIG. 10(c) shows the result of EMI shielding efficiency measurement according to mass % of the iron oxide-graphene composite.

DETAILED DESCRIPTION OF THE EMBODIMENTS

Hereinafter, preferred examples are presented to aid in understanding of the invention. However, the following examples are provided only for illustrative purposes, and the scope of the present invention is not limited thereto.

EXAMPLE 1

4 g of pristine graphite and 20 g of $FeCl_3$ were added to a round bottom flask and mixed, and then the mixture was heat-treated at 337° C. for 3 days (72 hours) in a box furnace. The product was cooled to room temperature and then dispersed in 400 mL of a dodecylamine solution and reacted at 90° C. for 6 hours. After the product was filtered, it was washed with 2 L of 10 mM HCl/EtOH solution and 500 mL of ethanol with a vacuum filter. Then, the product was dried to prepare graphite intercalated with iron oxide, and the resultant was named 'FeO$_x$-GIC'.

0.1 g of the FeO$_x$-GIC and 0.04 g of PVP were added to water and homogenized at a high speed for 1 hour at 5000 rpm using a high-speed homogenizer (Silverson model L5M mixer). Then, the resultant was sonicated at a frequency of 40 kHz for 30 minutes with an ultrasonic processor to prepare a magnetic iron oxide-graphene composite.

EXAMPLE 2

A magnetic iron oxide-graphene complex was prepared in the same manner as in Example 1 except that hexylamine was used instead of dodecylamine.

EXAMPLE 3

2.5 g of FeO$_x$-GIC prepared in Example 1 and 0.5 g of PVP were added to 500 mL of NMP and homogenized at a high speed of 5000 rpm for 1 hour using a high-speed homogenizer (Silverson model L5M mixer).

Then, the solution was fed to the inlet of the high-pressure homogenizer. The high-pressure homogenizer has a structure including an inlet of the raw material, an outlet of the exfoliated product, and a micro-channel that connects between the inlet and the outlet and has a diameter in a micrometer scale. The feed solution was introduced in the inlet while applying a high-pressure of 800 to 1200 bar, and a high shear force was applied while passing through a micro-channel having a diameter of 75 μm. The solution recovered from the outlet was again reintroduced to the inlet of the high-pressure homogenizer, and this process was repeated until the number of times the solution passed through the micro-channel reached 5 times, thereby preparing a magnetic iron oxide-graphene composite.

EXPERIMENTAL EXAMPLE 1

In order to confirm the interlayer spacing of graphite after the primary amine treatment, the graphite up to the primary amine treatment of Examples 1 and 2 was confirmed by SEM images, and the results are shown in FIG. 2.

FIG. 2(a) shows pristine graphite, and FIG. 2(b) shows graphite in which $FeCl_3$ is intercalated. In contrast, it was confirmed that the interlayer spacing of graphite was wider after the primary amine treatment as shown in FIGS. 2(c) and 2(d).

Further, Raman analysis and XRD analysis were performed on each of the above materials, and the results are shown in FIG. 3 and FIG. 4, respectively.

As shown in FIG. 3, the change in the position of D peak occurs because the Fermi energy level is lowered due to the charge transfer of $FeCl_3$ (acceptor) in graphite (donor). Therefore, it was confirmed that $FeCl_3$ was properly intercalated between the interlayers of graphite. Furthermore, after the primary amine substitution, it was confirmed that the D peak returned to its original position, and from this, it was confirmed that $FeCl_3$ was properly surrounded by the primary amine.

In addition, as shown in FIG. 4, the intrinsic peak of the graphite intercalated with $FeCl_3$ (stage 1) was confirmed, and after the primary amine treatment, the interlayer spacing of the graphite became wider, confirming that the intrinsic peak disappeared.

EXPERIMENTAL EXAMPLE 2

The magnetic iron oxide-graphene composite prepared in Example 1 was analyzed by TEM and HR-TEM, and the results are shown in FIG. 5. As shown in FIG. 5, it was confirmed that graphene having a thickness of about 1 to 5 nm was prepared.

Further, the magnetic iron oxide-graphene composite prepared in Example 1 was analyzed by STEM EDS MAPPING, and whether it exhibited magnetic properties was confirmed and shown in FIG. 6. As shown in FIG. 6(a), it was confirmed that iron oxide was formed on the surface of graphene, and as shown in FIG. 6(b), it was confirmed that the composite exhibited magnetic properties.

EXPERIMENTAL EXAMPLE 3

The magnetic iron oxide-graphene composite prepared in Example 3 was analyzed by SEM image for each preparation step, and the results are shown in FIG. 7.

As shown in FIG. 7, the interlayer spacing of the graphite was widened by the primary amine treatment (DA) (FIG. 7(a)), and it was confirmed that the magnetic iron oxide-graphene composite was formed through the high-speed homogenization (FIG. 7(b)) and high-pressure homogenization (FIG. 7(c)).

EXPERIMENTAL EXAMPLE 4

The average lateral size of the magnetic iron oxide-graphene composite prepared in Example 3 was analyzed by SEM image, and the results are shown in FIG. 8. As shown in FIG. 8, it was confirmed that the average lateral size of the magnetic iron oxide-graphene composite ranged from about 0.5 μm to 7 μm and that the average size was about 2.38 μm.

In addition, the average thickness of the magnetic iron oxide-graphene composite prepared in Example 3 was analyzed by AFM, and the results are shown in FIG. 9. As shown in FIG. 9, it was confirmed that the thickness of the magnetic iron oxide-graphene composite ranged from about 0.5 nm to 15 nm and that the average thickness was about 4 nm. From this, it can be confirmed that the graphene having a small thickness was generally prepared.

EXPERIMENTAL EXAMPLE 5

An appropriate amount of the iron oxide-graphene complex prepared in Example 3 was added to PMMA/Chloroform solution, and the chloroform used as a solvent for 3 to 6 hours at 60 to 75° C. was evaporated, followed by vacuum drying for 12 hours to evaporate the residual chloroform at 60° C. After vacuum drying, a sheet in the form of a film was prepared by pressurizing at 5 MPa and 210° C. for 10 minutes using a hot press, and EMI shielding efficiency was measured. The measurement results are shown in FIG. 10.

The invention claimed is:

1. A method for preparing a magnetic iron oxide-graphene composite comprising the steps of:
   mixing graphite and a halogen salt of iron and heat-treating the same (Step 1);
   reacting the product of step 1 with a ($C_{1-20}$ alkyl) amine (Step 2);
   washing the product of step 2 (Step 3);
   subjecting the product of step 3 to a high-speed homogenization (Step 4); and
   subjecting the product of step 4 to sonication or a high-pressure homogenization (Step 5),
   wherein the high-speed homogenization of step 4 is carried out by stirring the product of Step 2 at 5000 to 8000 rpm,
   wherein the high-pressure homogenization of step 5 is carried out by passing the product of step 4 through a high-pressure homogenizer including an inlet, an outlet, and a micro-channel that connects between the inlet and the outlet and has a diameter in a micrometer scale,
   wherein the product of step 4 is introduced to the inlet of the high-pressure homogenizer under application of a pressure of 500 to 3000 bar and passes through the micro-channel.

2. The method according to claim 1, wherein the halogen salt of iron is $FeCl_3$, $FeCl_2$, or a mixture thereof.

3. The method according to claim 1, wherein, in step 1, the weight ratio between graphite and halogen salt of iron is 1:1 to 1:10.

4. The method according to claim 1, wherein the heat treatment is carried out at 300° C. to 400° C.

5. The method according to claim 1, wherein the step 1 is carried out for 24 hours or more.

6. The method according to claim 1, wherein ($C_{1-20}$ alkyl) amine is hexylamine, or dodecylamine.

7. The method according to claim 1, wherein the step 2 is carried out at 30° C. to 250° C. for 6 hours or more.

8. The method according to claim 1, wherein the step 4 is carried out for 0.5 to 3 hours.

9. The method according to claim 1, wherein the micro-channel has a diameter of 50 to 300 μm.

10. The method according to claim 1, wherein the step 5 is additionally carried out for 2 to 10 times.

11. The method according to claim 1, wherein the iron oxide of the magnetic iron oxide-graphene composite is $Fe_3O_4$, or $Fe_2O_3$.

\* \* \* \* \*